(12) United States Patent
Kilroy

(10) Patent No.: US 7,741,737 B2
(45) Date of Patent: Jun. 22, 2010

(54) SOLID STATE POWER CONTROL AND METHOD FOR REDUCING CONTROL POWER

(75) Inventor: Donald A. Kilroy, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 705 days.

(21) Appl. No.: 11/430,619

(22) Filed: May 9, 2006

(65) Prior Publication Data

US 2007/0262652 A1    Nov. 15, 2007

(51) Int. Cl.
*H01H 33/39* (2006.01)
(52) U.S. Cl. ..................................................... 307/140
(58) Field of Classification Search .................. 307/140
See application file for complete search history.

(56) References Cited

U.S. PATENT DOCUMENTS

| 4,656,365 | A | | 4/1987 | Billings |
| 4,698,748 | A | * | 10/1987 | Juzswik et al. ............... 713/322 |
| 6,246,677 | B1 | * | 6/2001 | Nap et al. ..................... 370/346 |
| 6,838,783 | B2 | * | 1/2005 | Stierle et al. ................ 307/10.1 |
| 2003/0204761 | A1 | * | 10/2003 | D'Alessio .................... 713/320 |
| 2006/0085099 | A1 | * | 4/2006 | Burlak et al. ................... 701/1 |

\* cited by examiner

*Primary Examiner*—Robert L. Deberadinis
(74) *Attorney, Agent, or Firm*—Carlson, Gaskey & Olds

(57) ABSTRACT

A solid state power control apparatus includes a switch and a microcontroller that controls the switch. The microcontroller receives serial communication and switches between an active state and a sleep state in response to the serial communication.

19 Claims, 3 Drawing Sheets

| MODE 66 | ENTRY POINT 68 | EXIT TO 70 | TASKS 72 |
|---|---|---|---|
| INITIALIZATION | APPLICATION OF POWER OR A PULSED RESET. | NORMAL MODE | POWER-UP TESTS AND PART INITIALIZATION |
| NORMAL | ALL | POWER INTERRUPT MODE (EXCEPT IF ACTIVE OR RECENT OVERCURRENT); DEFAULT TIMER | FULL OPERATION AND SERIAL COMMUNICATIONS |
| POWER INTERRUPT | NORMAL MODE | NORMAL MODE DEFAULT OFF MODE DEFAULT TIMER MODE | IF SERIAL COMMUNICATIONS IS NOT MAINTAINED (MICROCONTROLLER COMMUNICATIONS TIMER EXPIRES): IMMEDIATELY CHANGE TO DEFAULT OFF MODE IF SSPC WAS OFF AND THE DEFAULT STATE IS OFF OR LAST COMMANDED STATE. MAINTAIN PRESENT SSPC OUTPUT CONFIGURE INTERRUPT ENABLES FOR TIMER AND SERIAL COMMUNICATIONS, PLACE MICROCONTROLLER INTO LOW POWER OPERATION. CONFIGURE INTERRUPT ENABLES FOR TIMER AND SERIAL COMMUNICATIONS, PLACE MICROCONTROLLER INTO LOW POWER OPERATION, NO PROTECTION (SSPC FUSIBLE LINK) IS AVAILABLE. |
| DEFAULT TIMER | POWER INTERRUPT MODE, NORMAL MODE | NORMAL MODE DEFAULT OFF MODE DEFAULT ON MODE | FULL OPERATION AND SERIAL COMMUNICATIONS. |
| DEFAULT OFF | POWER INTERRUPT MODE DEFAULT TIMER MODE | NORMAL MODE | SSPC OFF, CONFIGURE INTERRUPT ENABLES FOR SERIAL COMMUNICATIONS, PLACE dsPIC INTO LOW POWER OPERATION. |
| DEFAULT ON | DEFAULT TIMER MODE | NORMAL MODE | SSPC ON, FULL OPERATION AND SERIAL COMMUNICATIONS AVAILABLE. |

FIG. 3

SOLID STATE POWER CONTROL AND METHOD FOR REDUCING CONTROL POWER

BACKGROUND OF THE INVENTION

This invention relates to vehicle power systems and, more particularly, to solid state power controls.

Vehicles, such as aircraft, typically utilize one or more power distribution units to distribute power from a primary power source to various vehicle systems. The solid state power controls in a power distribution unit typically includes an electronic switch, such as a FET, and electronic circuitry that provides wiring protection. The FET and circuitry are often referred to as a solid state power controller ("SSPC"). The SSPC provides a circuit breaker function to protect downstream loads and has found widespread use because of its desirable status capability, reliability, and packaging density. A typical power distribution unit may include hundreds or thousands of SSPC's.

The electronic circuitry of the SSPC typically includes a microcontroller that uses power from the primary power source to control the FET. In one arrangement, a DC to DC converter converts the voltage from the primary power source to a lower voltage for the SSPC. Additional power stages may also be used to provide isolation on a per FET basis. The voltage conversion is not 100% efficient and results in a power loss in each stage of power conversion.

One disadvantage of a typical SSPC is that the microcontroller continually draws power from the converter and power source. This results in continuous power losses in the converters. In a power distribution unit that includes hundreds or thousands of SSPC's, the cumulative power losses represent a significant inefficiency. Further, the SSPC power usage may occupy significant amounts of the available power from the primary power source.

There is a need for a SSPC that uses less power and reduces power losses. This invention addresses those needs while avoiding the shortcomings and drawbacks of the prior art.

SUMMARY OF THE INVENTION

An example solid state power control apparatus includes a switch and a microcontroller that controls the switch. The microcontroller receives communication signals and switches between an active state and a sleep state in response to interruption of the communication signals for a time period.

An example method of controlling a solid state power control includes the steps of sending communication signals to a microcontroller of a solid state power controller and selectively switching the microcontroller between an active state and a sleep state in response to interruption of the communication signals.

An example solid state power control system includes a power source that provides an amount of electric output to a solid state power control. The solid state power control includes a switch and a microcontroller that controls the switch. The microcontroller receives communication signals and switches between an active state and a sleep state in response to the signals. In the active state, the microcontroller consumes a first amount of electric output from the power source. In the sleep state, the microcontroller consumes a second amount of electric output that is lower than the first amount from the power source.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

FIG. 3 illustrates a table showing example default operational modes of a solid state power controller.

DETAILED DESCRIPTION OF THE PREFERRED EMBODIMENT

Figure 1:
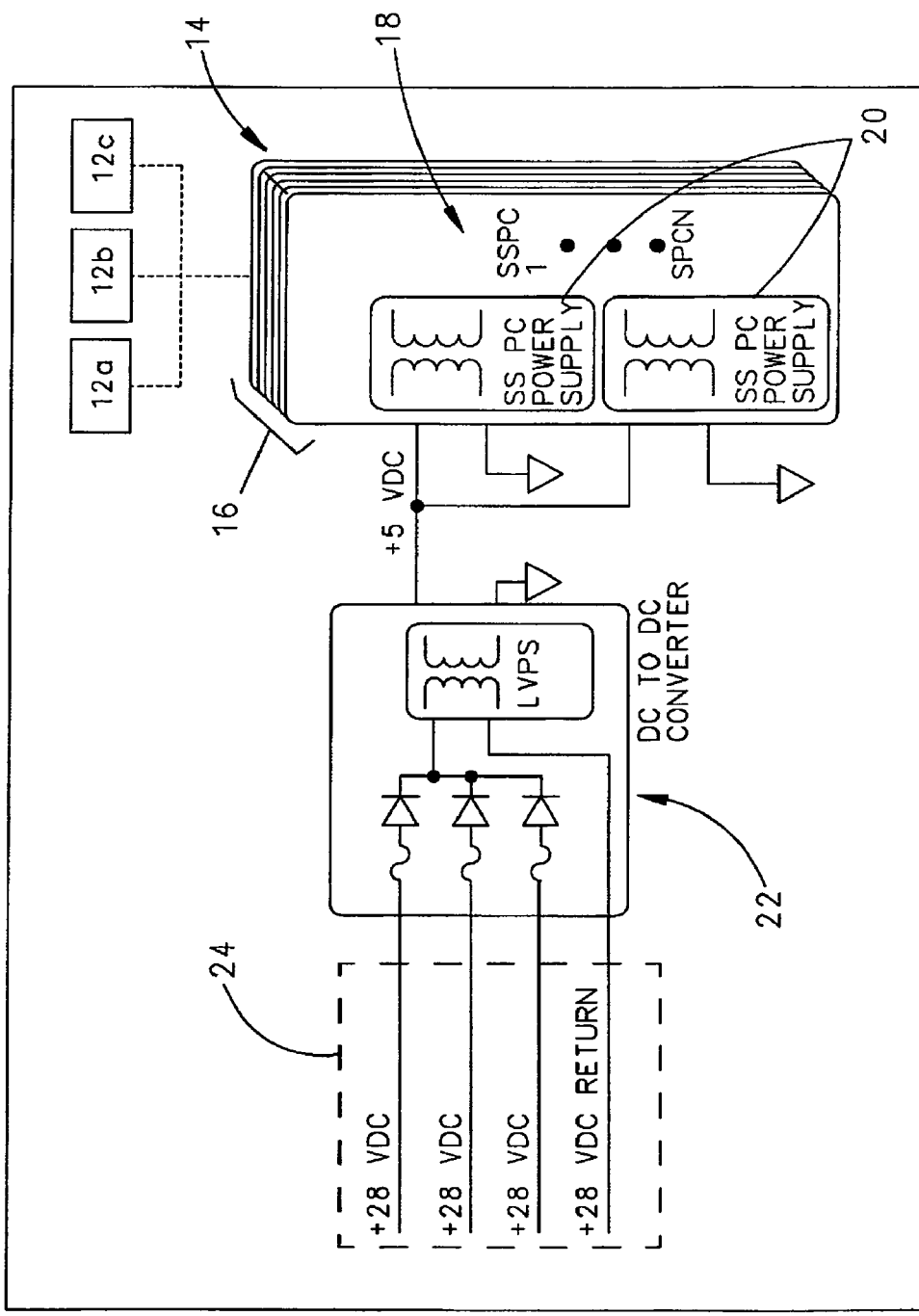
FIG. 1 illustrates selected portions of an example vehicle having a solid state power controller.

FIG. 1 schematically illustrates selected portions of an example vehicle 10, such as an aircraft or other vehicle. In this example, the vehicle 10 includes powered vehicle systems 12A, 12B, and 12C. A power distribution unit 14, such as a remote power distribution unit or a secondary power distribution unit, provides power to the vehicle systems 12A, 12B, and 12C. In the illustrated example, the power distribution unit 14 includes a plurality of power modules 16, each having a plurality of solid state power controllers 18 ("SSPC"). The SSPCs 18 provide a circuit breaker function to protect wiring associated with the powered vehicle systems 12A, 12B, and 12C.

Each of the SSPCs 18 includes a power supply 20 that facilitates operation of the SSPCs 18. In the disclosed example, each SSPC power supply 20 draws power from a low voltage power source 22 that in turn draws its power from a primary vehicle power source 24. In this example, the low voltage power source 22 converts the voltage output of the primary vehicle power source 24 to a lower voltage for the power supplies 20.

The power supply 20 and the low voltage power source 22 are not 100% efficient, and a portion of the input power from the primary vehicle power source 24 is lost in each conversion (i.e., a power loss). Thus, greater power draw incurs greater power loss. In the disclosed example, the SSPCs 18 use less power than previously known SSPCs. This reduces the amount of power used from the primary vehicle power source 24 and reduces the power losses of the power supply 20 and low voltage power sources 22, as will be described below.

Figure 2:
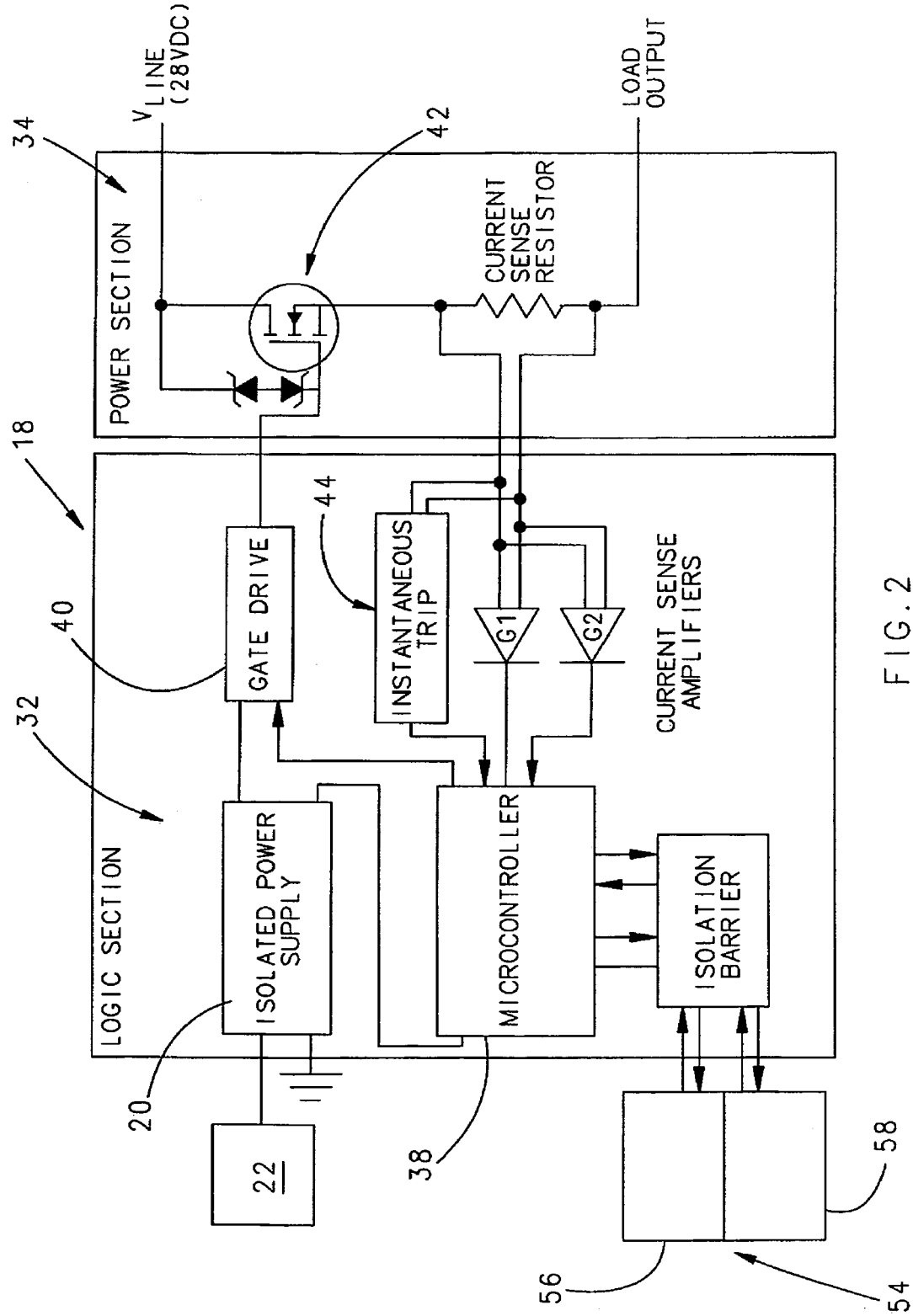
FIG. 2 illustrates selected portions of an example solid state power controller.

FIG. 2 illustrates selected portions of an example SSPC 18. In this example, the SSPC 18 includes a logic section 32 and a power section 34. The logic section 32 includes the power supply 20, which provides power to a microcontroller 38 that controls operation of the SSPC 18. The microcontroller 38 interfaces with a gate drive 40, a switch 42, and an instantaneous trip module 44. The instantaneous trip module 44 senses the electrical current flow through the SSPC 18 and communicates the current magnitude to the microcontroller 38. If the current exceeds a preset trip, the microcontroller 38 opens the switch 42 to protect the downstream wiring.

In the disclosed example, the microcontroller 38 is in serial communication with a vehicle control 54. In this example, the vehicle control 54 includes an active microprocessor 56 and a standby microprocessor 58. The active microprocessor 56 communicates with the microcontroller 38 to control the operation of the SSPC 18. The standby microprocessor 58 communicates with the microcontroller 38 to establish or maintain a status of the SSPC 18. Each of the active microprocessor 56 and the standby microprocessor 58 send periodic signals to the microcontroller 38 to confirm that communication between the vehicle control 54 and the SSPC 18 has not been interrupted.

The SSPC 18 has an active state and a sleep state to reduce the amount of power used from the primary vehicle power source 24, thereby reducing the power losses of the power supply 20 and low voltage power sources 22. The power supply 20 draws power from the low voltage power source 22 while in the active state and draws a significantly reduced amount of power while in the sleep state. This reduces the power draw and the power losses.

The state depends upon the communication between the microcontroller 38 and the active and standby microprocessors 56 and 58, and a default operational mode of the SSPC 18. In one example, as long as either the active microprocessor 56 or the standby microprocessor 58 remain in communication with the microcontroller 38, the SSPC 18 is in the active state. However, to reduce the power losses by lowering the current draw, the SSPC 18 enters the sleep state if communication from the active microprocessor 56 and the standby microprocessor 58 is interrupted. Optionally, the SSPC 18 is periodically awakened out of the sleep state to provide the vehicle control 54 with the SSPC 18 status.

In one example, the SSPC 18 switches into the sleep state based upon the default mode of the SSPC 18. In the example shown in FIG. 3, the SSPC 18 has six possible default modes 66 that include: INITIALIZATION, NORMAL, POWER INTERRUPT, default TIMER, Default OFF, and default ON. Each default mode 66 includes one or more entry points 68 from which the SSPC 18 can enter the specific default mode 66. The default modes 66 also include one or more exits 70 that the SSPC 18 switches into from the particular default mode 66. Each of the default modes 66 also has one or more associated tasks 72. Thus, cooperation between the default modes 66, entry points 68, and exits 70 allow the SSPC 18 to be programmed to switch between the default modes 66 as desired in response to interrupted communications.

In one example, the SSPC 18 is initially operating in the NORMAL mode when the periodic communication with the active microprocessor 56 and the standby microprocessor 58 becomes interrupted. In this example, the NORMAL mode is programmed to switch into the POWER INTERRUPT mode in response to such conditions.

In POWER INTERRUPT mode, the microcontroller 38 counts for a predetermined time period. For example, the time period can be preset to a desired time period. The POWER INTERRUPT mode is programmed for several different responses, depending on whether or not communication is restored between the microcontroller 38 and the active and standby microprocessors 56 and 58 within the time period.

In one example, if the time period expires without restored communication, the POWER INTERRUPT mode is programmed to immediately switch into Default OFF mode. In this example, the microcontroller 38 switches into Default OFF mode only if the SSPC 18 is off or programmed for a LAST COMMANDED mode (which reverts back to the last command). Under such conditions, the microcontroller 38 is in the sleep state (i.e., low power operation). In the sleep state, the power supply 20 draws a reduced amount of power from the low voltage power source 22, thereby reducing the power losses upon interruption of serial communication.

However, if communication is restored before the time period expires, the POWER INTERRUPT mode is programmed to switch into either the NORMAL mode or the default TIMER mode. If communication is restored only with the active microprocessor 56 and not the standby microprocessor 58, the POWER INTERRUPT mode is programmed to switch into the NORMAL mode. If communication is restored only with the standby microprocessor 58 and not the active microprocessor 56, the POWER INTERRUPT mode is programmed to switch into the default TIMER mode.

In default TIMER mode, the microcontroller 38 counts for a predetermined time period (e.g., a different time period than in the POWER INTERRUPT mode). If the time period expires before the active microprocessor 56 establishes periodic communication with the microcontroller 38, the default TIMER mode is programmed to switch into Default OFF mode. Under such conditions, the microcontroller 38 is in the sleep state. In the sleep state, the power supply 20 draws reduced power from the low voltage power source 22, thereby reducing the power losses upon interruption of serial communication.

However, if the active microprocessor 56 re-establishes periodic communication with the microcontroller 38 before the time period expires, the default TIMER mode is programmed to switch back into the NORMAL mode. Alternatively, the default TIMER mode is programmed to switch into the default ON mode rather than the Default OFF mode if the time period expires. In such an example, the SSPC 18 is prevented from being in the sleep state.

In another example, the SSPC 18 is initially operating in NORMAL mode when the periodic communication with the active microprocessor 56 becomes interrupted. In this example, the communication between the microcontroller 38 and the standby microprocessor 58 has not been interrupted. The NORMAL mode is programmed to switch into the default TIMER mode in response to such a condition, which functions similar to as described above. However, in this example, the microcontroller 38 remains in the active state under such conditions since communication with the standby microprocessor 58 has not been interrupted.

In another example, the SSPC 18 is initially operating in NORMAL mode when the periodic communication with the standby microprocessor 58 becomes interrupted. In this example, the communication between the microcontroller 38 and the active microprocessor 56 has not been interrupted. The NORMAL mode is programmed to remain in NORMAL mode in response to such a condition.

As can be appreciated, the SSPC 18 of the disclosed examples autonomously switches between an active state and a sleep state without active command from the vehicle control 54 or other remotely located control. In the sleep state, the SSPC draws less power from the primary vehicle power source 24 through the low voltage power source 22. In addition to using less power, this also provides the benefit of reducing the losses in the low voltage power source 22. Such benefits are even more significant when spread across hundreds or even thousands of SSPCs 18 within the power distribution unit 14.

Although a preferred embodiment of this invention has been disclosed, a worker of ordinary skill in this art would recognize that certain modifications would come within the scope of this invention. For that reason, the following claims should be studied to determine the true scope and content of this invention.

We claim:

1. A solid state power control apparatus comprising:
   a switch;
   a microcontroller that controls the switch and receives communication signals, the microcontroller having an active state and a sleep state, wherein the sleep state corresponds to interruption of the communication signals for a predetermined time period;
a first, operation microprocessor operable to control operation of the solid state power control; and
a second, status microprocessor operable to communicate with the microcontroller to control a status of the solid state power control, wherein the microcontroller receives the communication signals from each of the first microprocessor and the second microprocessor.

2. A solid state power control apparatus comprising:
a switch;
a microcontroller that controls the switch and receives communication signals, the microcontroller having an active state and a sleep state, wherein the sleep state corresponds to interruption of the communication signals for a predetermined time period;
a first, operation microprocessor operable to control operation of the solid state power control; and
a second, status microprocessor operable to communicate with the microcontroller to control a status of the solid state power control, wherein the microcontroller receives the communication signals from each of the first microprocessor and the second microprocessor, wherein the first microprocessor communicates command data to the microcontroller to open or close the switch and the second microprocessor communicates with the microcontroller to exchange switch status data.

3. The apparatus as recited in claim 2, wherein the communication signals comprise serial signals and the time period corresponds to the time between successive serial signals.

4. The apparatus as recited in claim 2, wherein the microcontroller is in the active state in response to receiving the serial signals.

5. The apparatus as recited in claim 2, wherein in the active state the microcontroller receives power from a power source and in the sleep state the microcontroller receives less power from the power source.

6. A method of controlling a solid state power controller, comprising:
(a) sending communication signals to a microcontroller of a solid state power controller, wherein step (a) includes sending the communication signals from each of a first microprocessor and a second microprocessor to the microcontroller;
(b) selectively switching the microcontroller between an active state and a sleep state in response to interruption of the communication signals; and
(c) selectively switching to the sleep state in response to a loss of serial communication signals.

7. The method as recited in claim 6, wherein step (b) includes supplying power to the microcontroller in the active state, and reducing the power supplied to the microcontroller in the sleep state.

8. The method as recited in claim 6, wherein step (a) includes switching to the sleep state in response to loss of the communication signals from each of the first microprocessor and the second microprocessor.

9. The method as recited in claim 8, wherein step (a) includes waiting a predetermined amount of time before switching to the sleep state in response to loss of the communication signals.

10. The method as recited in claim 6, wherein the microcontroller includes logic that autonomously switches the microcontroller between the active state and the sleep state in response to the interruption of the communication signals.

11. The method as recited in claim 6, wherein step (a) includes sending communication signals from the first microprocessor to control the operation of the solid state power controller and sending communication signals from the second microprocessor to control a status of the solid state power controller.

12. The method as recited in claim 11, wherein the first microprocessor is an active microprocessor and the second microprocessor is a standby microprocessor.

13. A solid state power control system comprising:
a power source that provides an amount of electric output; and
a solid state power control comprising:
a switch; and
a microcontroller that controls the switch and receives communication signals, the microcontroller having an active state and a sleep state, the sleep state corresponding to interruption of the communication signals for a predetermined time period, wherein the microcontroller autonomously switches between the active state and the sleep state in response to interruption of the communication signals, and wherein the microcontroller consumes a first amount of electric output in the active state and consumes a second amount of electric output in the sleep state that is less then the first amount;
a first, operation microprocessor operable to control operation of the solid state power control; and
a second, status microprocessor operable to communicate with the microcontroller to control a status of the solid state power control, wherein the microcontroller receives the communication signals from each of the first microprocessor and the second microprocessor.

14. The system as recited in claim 13, wherein the communication signals comprise serial signals and the time period corresponds to the time between successive serial signals.

15. The system as recited in claim 13, wherein the power source includes a converter that converts an electric input to the electric output with a power loss.

16. The system as recited in claim 15, wherein the power loss is proportional to the amount of electric output such that there is less power loss in the sleep state than in the active state.

17. The system as recited in claim 15, wherein the power source draws the electric input from a vehicle power source.

18. The system as recited in claim 17, wherein the electric input drawn from the vehicle power source is proportional to the amount of electric output such that there is less electric input drawn in the sleep state than in the active state.

19. The system as recited in claim 17, wherein the solid state power control is one of a plurality of like solid state power controls that are each powered by the power source.

* * * * *